(12) United States Patent
Liou et al.

(10) Patent No.: US 10,879,378 B2
(45) Date of Patent: Dec. 29, 2020

(54) SEMICONDUCTOR STRUCTURE

(71) Applicant: United Microelectronics Corp., Hsinchu (TW)

(72) Inventors: En-Chiuan Liou, Tainan (TW); Yu-Cheng Tung, Kaohsiung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/791,563

(22) Filed: Feb. 14, 2020

(65) Prior Publication Data
US 2020/0185511 A1 Jun. 11, 2020

Related U.S. Application Data

(62) Division of application No. 15/675,380, filed on Aug. 11, 2017, now abandoned.

(30) Foreign Application Priority Data

Jul. 24, 2017 (CN) .......................... 2017 1 0606013

(51) Int. Cl.
*H01L 29/66* (2006.01)
*H01L 29/78* (2006.01)
*H01L 21/8234* (2006.01)
*H01L 21/3115* (2006.01)
*H01L 21/8238* (2006.01)
*H01L 27/092* (2006.01)

(52) U.S. Cl.
CPC .... *H01L 29/66803* (2013.01); *H01L 21/3115* (2013.01); *H01L 21/823431* (2013.01); *H01L 21/823821* (2013.01); *H01L 27/0924* (2013.01); *H01L 29/785* (2013.01); *H01L 29/7831* (2013.01)

(58) Field of Classification Search
CPC ........... H01L 29/66803; H01L 21/3115; H01L 21/823431; H01L 29/7831; H01L 29/7856; H01L 29/66795; H01L 21/266; H01L 21/324; H01L 21/2253; H01L 21/2255; H01L 21/022; H01L 21/02129; H01L 21/823821; H01L 27/0886; H01L 27/0924
See application file for complete search history.

(56) References Cited

U.S. PATENT DOCUMENTS 9,147,730 B2   9/2015  Xie et al.
9,455,198 B1   9/2016  Yu et al.
9,570,339 B2   2/2017  Liou et al.
(Continued)

*Primary Examiner* — Mouloucoulaye Inoussa
(74) *Attorney, Agent, or Firm* — J.C. Patents

(57) ABSTRACT

Provided is a semiconductor structure including a substrate, a doping layer, and a dielectric layer. The substrate has a plurality of fin portions and at least one recessed portion, wherein the at least one recessed portion is located between two adjacent fin portions of the plurality of fin portions and a bottom surface of the at least one recessed portion is lower than a surface of the substrate between the two of the plurality of fin portions. The doping layer is disposed on a sidewall of the plurality of fin portions, the surface of the substrate, and a sidewall and a bottom portion of the at least one recessed portion. The dielectric layer is disposed on the doping layer. A top surface of the doping layer and a top surface of the dielectric layer are lower than a top surface of each of the plurality of fin portions.

9 Claims, 7 Drawing Sheets

(56) References Cited

U.S. PATENT DOCUMENTS

| | | |
|---|---|---|
| 9,679,819 B1 | 6/2017 | Tung |
| 9,837,417 B1 | 12/2017 | Liou et al. |
| 2012/0049294 A1 | 3/2012 | Chen et al. |
| 2015/0372144 A1 | 12/2015 | Fang et al. |
| 2016/0225906 A1* | 8/2016 | Wang .................... H01L 29/785 |
| 2016/0351411 A1 | 12/2016 | Xie et al. |
| 2017/0103985 A1* | 4/2017 | Kim .................. H01L 21/82382 |

* cited by examiner

SEMICONDUCTOR STRUCTURE

CROSS REFERENCE TO RELATED APPLICATION

This application is a divisional application of and claims the priority benefit of U.S. application Ser. No. 15/675,380, filed on Aug. 11, 2017, now pending, which claims the priority benefit of China application serial no. 201710606013.7, filed on Jul. 24, 2017. The entirety of each of the above-mentioned patent applications is hereby incorporated by reference herein and made a part of specification.

BACKGROUND OF THE INVENTION

Field of the Invention

The invention relates to a semiconductor structure and a manufacturing method thereof, and more particularly, to a semiconductor structure having fin portions and a recessed portion, wherein the recessed portion has a doping layer, and a manufacturing method thereof.

Description of Related Art

With the rapid development in semiconductor process techniques, to increase the speed and the performance of devices, the size of the entire circuit device needs to be continuously reduced, and device density needs to be continuously increased. Currently, a three-dimensional multi-gate structure such as a fin field effect transistor (FinFET) has been developed to replace the planar complementary metal-oxide-semiconductor (CMOS) device. The FinFET has fin portions extended perpendicularly upward from the surface of the substrate and a gate disposed in the surrounding the fin portions to provide better electrical control to the channels of the FinFET.

SUMMARY OF THE INVENTION

The invention provides a semiconductor structure, wherein a doping layer is disposed in the recessed portion between the fin portions.

The invention provides a manufacturing method of a semiconductor structure for manufacturing the semiconductor structure.

The semiconductor structure of the invention includes a substrate, a doping layer, and a dielectric layer. The substrate has a plurality of fin portions and at least one recessed portion, wherein the at least one recessed portion is located between two adjacent fin portions of the plurality of fin portions and a bottom surface of the at least one recessed portion is lower than a surface of the substrate between the two of the plurality of fin portions. The doping layer is disposed on a sidewall of the plurality of fin portions, the surface of the substrate, and a sidewall and a bottom portion of the at least one recessed portion. The dielectric layer is disposed on the doping layer. A top surface of the doping layer and a top surface of the dielectric layer are lower than a top surface of each of the plurality of fin portions. The doping layer includes a first doping layer of a first conductivity type and second doping layer of a second conductivity type, and the plurality of fin portions comprise at least one first fin portion and at least one second fin portion.

In an embodiment of the semiconductor structure of the invention, the doping layer completely fills the at least one recessed portion.

In an embodiment of the semiconductor structure of the invention, the doping layer partially fills the at least one recessed portion.

In an embodiment of the semiconductor structure of the invention, the first doping layer is disposed on a sidewall of the first fin portion, a portion of the surface of the substrate, and a portion of the sidewall and a portion of the bottom portion of the at least one recessed portion, and the second doping layer is disposed on a sidewall of the second fin portion, a remaining sidewall and a remaining bottom portion of the at least one recessed portion, and the first doping layer in the at least one recessed portion.

In an embodiment of the semiconductor structure of the invention, the first doping layer and the second doping layer completely fill the at least one recessed portion.

In an embodiment of the semiconductor structure of the invention, the first doping layer and the second doping layer partially fill the at least one recessed portion.

In an embodiment of the semiconductor structure of the invention, the first doping layer completely fills the at least one recessed portion.

In an embodiment of the semiconductor structure of the invention, the substrate has a first recessed portion and a second recessed portion located between the first fin portion and the second fin portion, the first doping layer is disposed on a sidewall of the first fin portion, a portion of the surface of the substrate, and a sidewall and a bottom portion of the first recessed portion, and the second doping layer is disposed on a sidewall of the second fin portion, a remaining surface of the substrate, and a sidewall and a bottom portion of the second recessed portion.

In an embodiment of the semiconductor structure of the invention, a conductive layer is further included. The conductive layer is disposed on the dielectric layer and the plurality of fin portions exposed by the dielectric layer, wherein the conductive layer and the at least one recessed portion are at least partially overlapped.

The manufacturing method of the semiconductor structure of the invention includes: providing a substrate, wherein the substrate has a plurality of fin portions and at least one recessed portion, the recessed portion is located between the fin portions, and the bottom surface of the recessed portion is lower than the surface of the substrate between the fin portions; forming a doping layer on the sidewall of the fin portions, the surface of the substrate, and the sidewall and the bottom portion of the recessed portion; and forming a dielectric layer on the doping layer. The top surface of the doping layer and the top surface of the dielectric layer are lower than the top surface of each of the fin portions.

In an embodiment of the manufacturing method of the semiconductor structure of the invention, the doping layer completely fills the recessed portion.

In an embodiment of the manufacturing method of the semiconductor structure of the invention, the doping layer partially fills the recessed portion.

In an embodiment of the manufacturing method of the semiconductor structure of the invention, the doping layer includes a first doping layer of a first conductivity type and a second doping layer of a second conductivity type, and the fin portions include at least one first fin portion and at least one second fin portion.

In an embodiment of the manufacturing method of the semiconductor structure of the invention, the first doping layer is disposed on the sidewall of the first fin portion, a portion of the surface of the substrate, and a portion of the sidewall and a portion of the bottom portion of the recessed portion, and the second doping layer is disposed on the sidewall of the second fin portion, the remaining sidewall and the remaining bottom portion of the recessed portion, and the first doping layer in the recessed portion.

In an embodiment of the manufacturing method of the semiconductor structure of the invention, the first doping layer and the second doping layer completely fill the recessed portion.

In an embodiment of the manufacturing method of the semiconductor structure of the invention, the first doping layer and the second doping layer partially fill the recessed portion.

In an embodiment of the manufacturing method of the semiconductor structure of the invention, the first doping layer completely fills the recessed portion.

In an embodiment of the manufacturing method of the semiconductor structure of the invention, the substrate has a first recessed portion and a second recessed portion located between the first fin portion and the second fin portion, the first doping layer is disposed on the sidewall of the first fin portion, a portion of the surface of the substrate, and the sidewall and the bottom portion of the first recessed portion, and the second doping layer is disposed on the sidewall of the second fin portion, the remaining surface of the substrate, and the sidewall and the bottom portion of the second recessed portion.

In an embodiment of the manufacturing method of the semiconductor structure of the invention, after the dielectric layer is formed, a conductive layer is further formed on the dielectric layer and the fin portions exposed by the dielectric layer, and the conductive layer and the recessed portion are at least partially overlapped.

Based on the above, in the semiconductor structure of the invention, a recessed portion is disposed between the fin portions, and a doping layer used for doping the substrate and the fin portions is disposed in the recessed portion.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
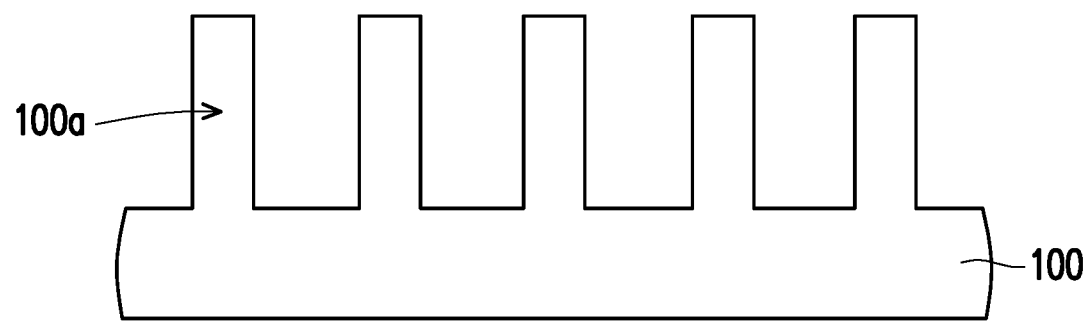
FIG. 1A to FIG. 1D are cross sections of a manufacturing process of a semiconductor structure shown according to the first embodiment of the invention.

FIG. 1A to FIG. 1D are cross sections of a manufacturing process of a semiconductor structure shown according to the first embodiment of the invention. First, referring to FIG. 1A, a substrate 100 having fin portions 100a is provided. The fin portions 100a are, for instance, formed by a patterning process performed on the bulk substrate 100. In an embodiment, a patterned hard mask layer (not shown) can be first formed on the substrate 100, and then an anisotropic etching process is performed by using the patterned hard mask layer as an etch mask to remove a portion of the substrate 100 to form the fin portions 100a. In this case, in a subsequent process, the top surface of the fin portions 100a can keep the patterned hard mask layer, and based on actual need, the patterned hard mask layer is removed from the top surface of the fin portions 100a at the right moment. In FIG. 1A, the number of the fin portions 100a is only exemplary, and the invention is not limited in this regard. Moreover, based on actual need, the height and width . . . etc. of the fin portions 100a can be adjusted.

Figure 1B:
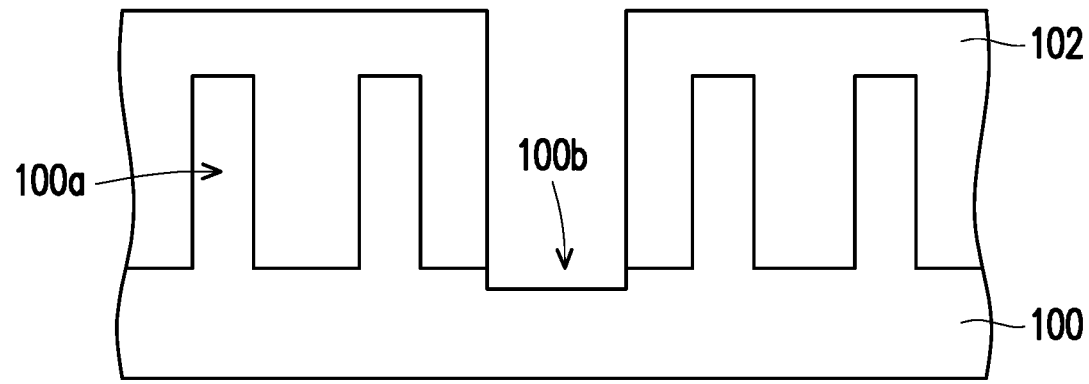

Then, referring to FIG. 1B, a patterned mask layer 102 is formed on the substrate 100. The patterned mask layer 102 is, for instance, a patterned photoresist layer. The patterned mask layer 102 exposes at least one of the fin portions 100a. In the present embodiment, the patterned mask layer 102 exposes one fin portion 100a and the surrounding substrate 100. In another embodiment, the patterned mask layer 102 may only expose the fin portion 100a without exposing the surrounding substrate 100. Next, an etching process is performed by using the patterned mask layer 102 as a mask to remove the exposed fin portion 100a and a portion of the surrounding substrate 100. The etching process is, for instance, an anisotropic etching process. In the present embodiment, after the exposed fin portion 100a is removed, a recessed portion 100b is formed in the substrate 100. The recessed portion 100b can be used to separate the fin portions 100a. The bottom surface of the recessed portion 100b is lower than the surface of the substrate 100 between the fin portions 100a. The width of the recessed portion 100b can be controlled by adjusting the region exposed by the patterned mask layer 102, and the depth of the recessed portion 100b can be controlled by adjusting the time of the etching process, and the invention is not particularly limited in this regard. In the present embodiment, only one of the fin portions 100a is removed, but in other embodiments, more of the fin portions 100a can be removed based on actual need. In the case where the patterned mask layer 102 only exposes the fin portion 100a without exposing the surrounding substrate 100, only the exposed fin portion 100a is removed, so that the formed recessed portion 100b has a width same as the width of the bottom of the fin portion 100a.

Figure 1C:
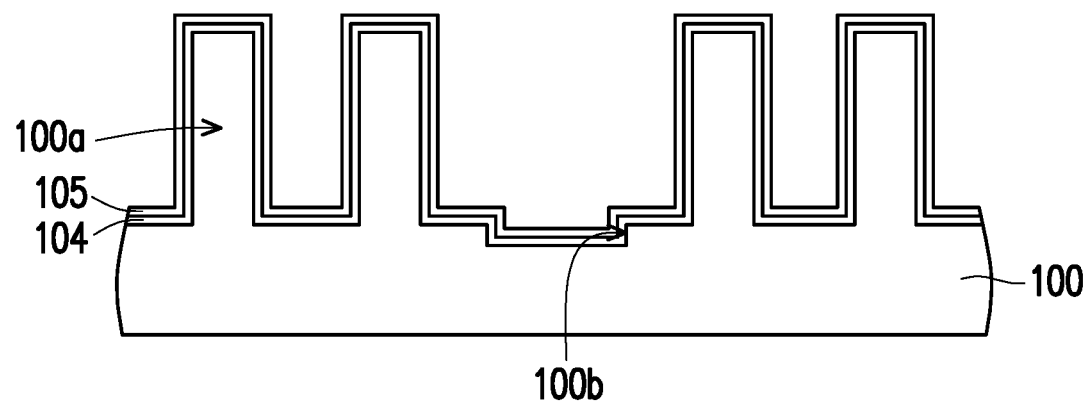

Next, referring to FIG. 1C, the patterned mask layer 102 is removed. At this point, the substrate 100 has a plurality of fin portions 100a and a recessed portion 100b located between the fin portions 100a. In the present embodiment, for a subsequent application, the conductivity types of a portion of the substrate 100 and a portion of the fin portions 100a need to be adjusted. Therefore, a dopant needs to be provided in a portion of the substrate 100 and the fin portions 100a. Detailed description is provided below.

A doping layer 104 is formed on the substrate 100. The doping layer 104 is a dielectric layer containing a P-type dopant or an N-type dopant. The dielectric layer is, for instance, an oxide layer, a nitride layer, or a carbide layer. The doping layer 104 can be formed by, for instance, a chemical vapor deposition (CVD) process or an atomic layer deposition (ALD) process. In the present embodiment, the doping layer 104 is, for instance, borosilicate glass (BSG). The doping layer 104 is conformally formed on the substrate 104 to cover the entire fin portions 100a and cover the sidewall and the bottom portion of the recessed portion 100b. Next, a liner 105 is formed on the doping layer 104.

The liner 105 is, for instance, a nitride layer. The doping layer 104 can be conformally formed on the doping layer 104 by, for instance, a CVD process or an ALD process.

Figure 1D:
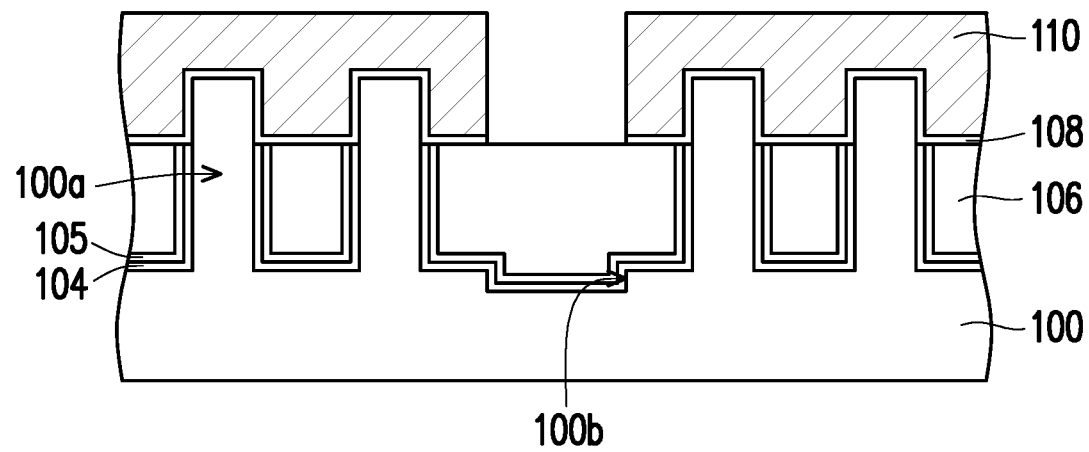

Then, referring to FIG. 1D, a dielectric layer 106 is formed on the substrate 100. The dielectric layer 106 covers the fin portions 100a and completely fills the recessed portion 100b. Next, an etch-back process is performed to remove a portion of the doping layer 104, a portion of the liner 105, and a portion of the dielectric layer 106 such that the top surfaces of the doping layer 104, the liner 105, and the dielectric layer 106 are lower than the top surface of the fin portions 100a, i.e., the upper end of the fin portions 100a is exposed. In the present embodiment, the top surfaces of the doping layer 104, the liner 105, and the dielectric layer 106 are coplanar, but the invention is not limited thereto. Next, an annealing treatment can be performed to diffuse the dopant in the doping layer 104 into the surrounding substrate 100 and the fin portions 100a. It should be mentioned that, the annealing treatment is not limited to be immediately performed after the etch-back process, and can be performed at any suitable time based on actual need.

After a portion of the doping layer 104, a portion of the liner 105, and a portion of the dielectric layer 106 are removed, the resulting structure can be used as the substrate for the manufacture of a finFET. Detailed description is provided below.

A dielectric layer 108 is conformally formed on the surfaces of the doping layer 104, the liner 105, the dielectric layer 106, and the exposed fin portions 100a, and a conductive layer 110 is formed on the dielectric layer 108. The dielectric layer 108 is used as the gate dielectric layer of a finFET, and the conductive layer 110 is used as the gate of the finFET. The forming methods of the dielectric layer 108 and the conductive layer 110 are known to those skilled in the art and are not repeated herein. Next, any known finFET process can be further performed. As a result, a finFET can be respectively formed in the regions separated by the recessed region 100b.

In the present embodiment, the recessed portion 100b separates the plurality of fin portions 100a, and the doping layer 104 is formed on the sidewall and the bottom portion of the recessed portion 100b. Moreover, in the present embodiment, after the dielectric layer 108 and the conductive layer 110 are formed, the conductive layer 110 and the recessed portion 100b are at least partially overlapped. Moreover, in the present embodiment, the doping layer 104 does not completely fill the recessed portion 100b, but the invention is not limited thereto. In other embodiments, the doping layer 104 can also completely fill the recessed portion 100b.

Figure 2A:
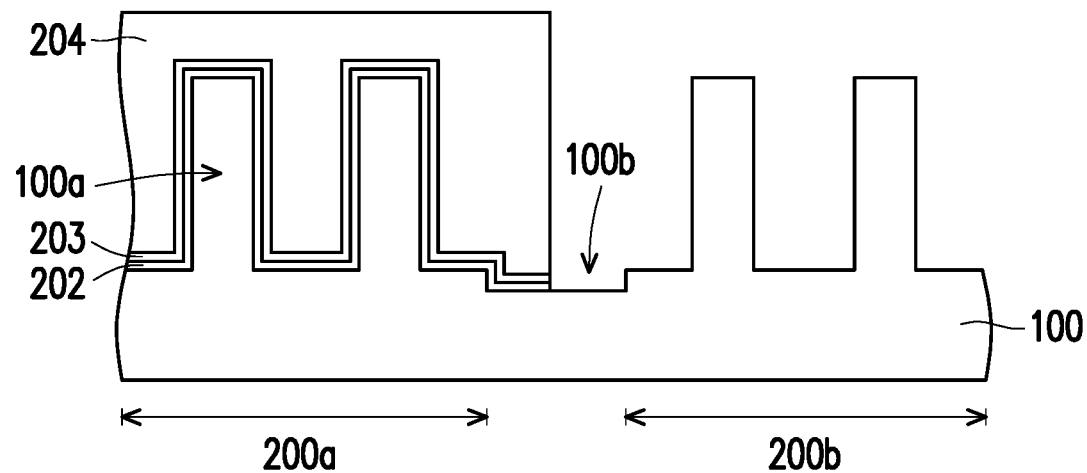
FIG. 2A to FIG. 2F are cross sections of a manufacturing process of a semiconductor structure shown according to the second embodiment of the invention.

FIG. 2A to FIG. 2E are cross section of a manufacturing process of a semiconductor structure shown according to the second embodiment of the invention. In the present embodiment, the step described in FIG. 2A is performed after FIG. 1B. First, referring to FIG. 2A, the patterned mask layer 102 is removed after the step of FIG. 1B. At this point, the substrate 100 has a plurality of fin portions 100a and a recessed portion 100b located between the fin portions 100a. In the present embodiment, the recessed portion 100b can separate the substrate 100 into a region 200a and a region 200b, wherein the region 200a and the region 200b each have a plurality of fin portions 100a.

Next, a doping layer 202 is formed on the substrate 100. In the present embodiment, the doping layer 202 is a dielectric layer containing a P-type dopant. The doping layer 202 and the doping layer 104 are similar in terms of material and forming method, which are not repeated herein. The doping layer 202 is conformally formed on the substrate 100 to cover all of the fin portions 100a and cover the sidewall and the bottom portion of the recessed portion 100b. Next, a liner 203 is formed on the doping layer 202. The liner 203 and the liner 105 are similar in terms of material and forming method, which are not repeated herein. Then, a mask layer 204 is formed on the substrate 100. In the present embodiment, the mask layer 204 not only covers the liner 203 in the region 200a, but also covers a portion of the liner 203 in the recessed portion 100b. Next, an etching process is performed by using the mask layer 204 as a mask to remove the liner 203 not covered by the mask layer 204 and the doping layer 202 below the liner 203.

Figure 2B:
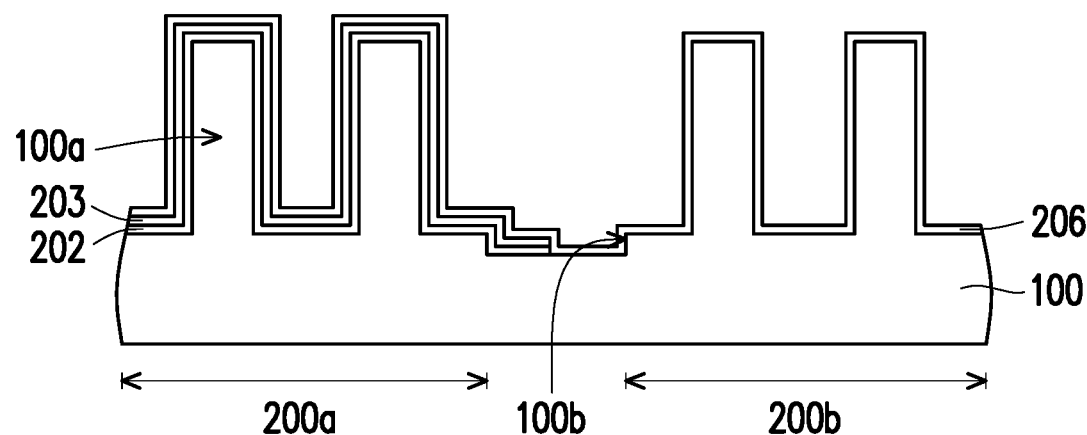

Next, referring to FIG. 2B, the mask layer 204 is removed. Next, a doping layer 206 is formed on the substrate 100. The doping layer 206 is a dielectric layer containing an N-type dopant. The doping layer 206 and the doping layer 104 are similar in terms of material and forming method, which are not repeated herein. The doping layer 206 is conformally formed on the substrate 100 to cover all of the fin portions 102a in the region 200b, cover the sidewall and the bottom portion of the recessed portion 100b not covered by the doping layer 202, and cover the liner 203. In the present embodiment, a doping layer 202 containing a P-type dopant and a doping layer 206 containing an N-type dopant are formed in the recessed portion 100b, and the doping layer 202 and the doping layer 206 only partially fill the recessed portion 100b.

Figure 2C:
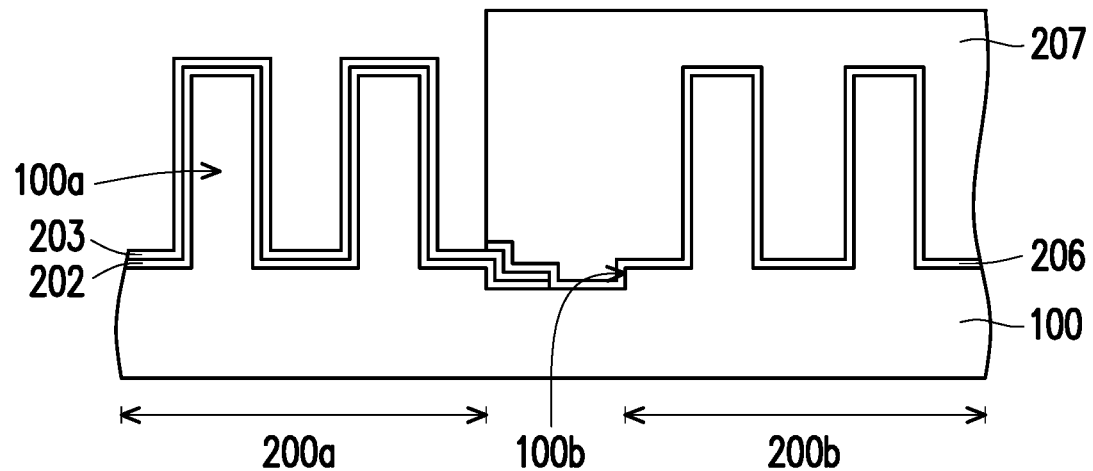

Next, referring to FIG. 2C, a mask layer 207 is formed on the substrate 100. In the present embodiment, the mask layer 207 not only covers the doping layer 206 in the region 200b, but also covers the doping layer 206 in the recessed portion 100b. Next, an etching process is performed by using the mask layer 207 as a mask to remove the doping layer 206 not covered by the mask layer 207.

Figure 2D:
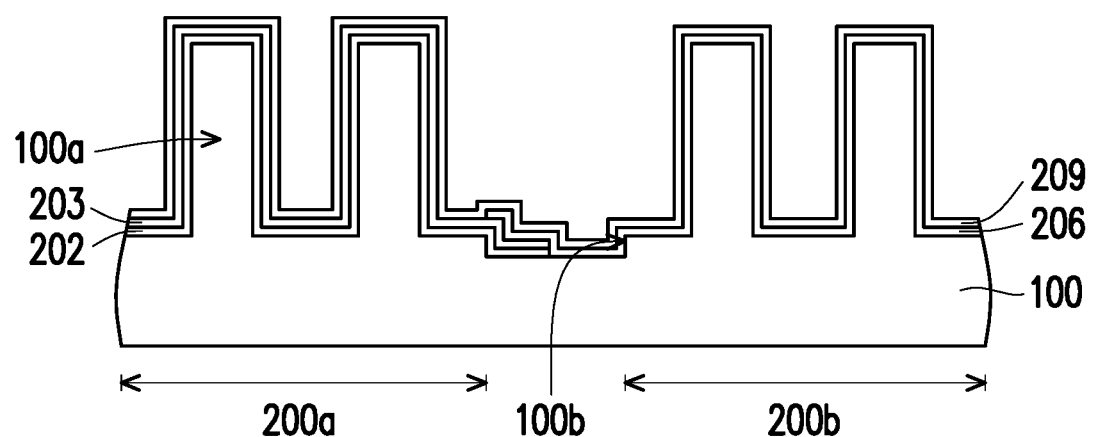

Next, referring to FIG. 2D, the mask layer 207 is removed, and then a liner 209 is formed on the doping layer 206 and the liner 203. The liner 209 and the liner 203 are similar in terms of material and forming method, which are not repeated herein.

Figure 2E:
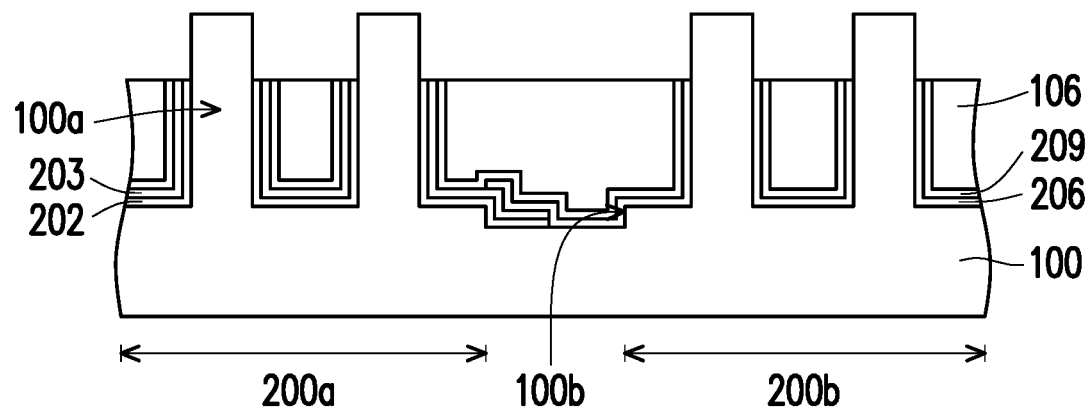

Next, referring to FIG. 2E, the step of FIG. 1D is performed to form a dielectric layer 106 on the substrate 100. Next, an etch-back process is performed to remove a portion of the doping layer 202, a portion of the liner 203, a portion of the doping layer 206, a portion of the liner 209, and a portion of the dielectric layer 106, such that the top surfaces of the doping layer 202, the liner 203, the doping layer 206, the liner 209, and the dielectric layer 106 are lower than the top surface of the fin portions 100a, i.e., the upper end of the fin portions 100a is exposed. In the present embodiment, the top surfaces of the doping layer 202, the liner 203, the doping layer 206, the liner 209, and the dielectric layer 106 are coplanar, but the invention is not limited thereto. Next, an annealing treatment can be performed to diffuse the dopant in the doping layer 202 and the doping layer 206 into the surrounding substrate 100 and the fin portions 100a of each thereof. It should be mentioned that, the annealing treatment is not limited to be immediately performed after the etch-back process, and can be performed at any suitable time based on actual need. After the dopant is diffused, the region 200a can be regarded as a P-type region, and the region 200b can be regarded as an N-type region.

Figure 2F:
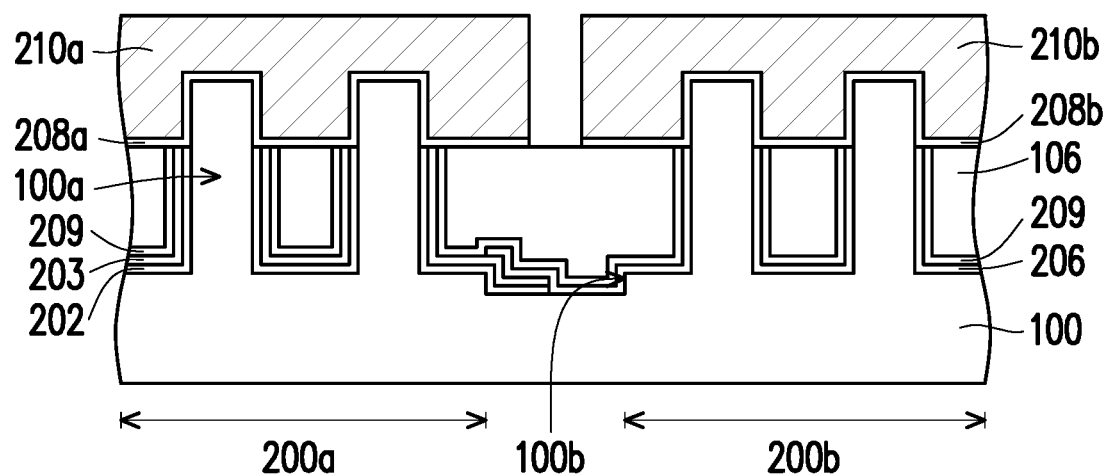

Next, referring to FIG. 2F, a dielectric layer 208a is conformally formed on the doping layer 202, the liner 203, the doping layer 206, the liner 209, the dielectric layer 106, and the surface of the exposed fin portions 100a in the region 200*a* and a conductive layer 210*a* is formed on the dielectric layer 208*a*, a dielectric layer 208*b* is conformally formed on the doping layer 206, the liner 209, the dielectric layer 106, and the surface of the exposed fin portions 100*a* in the region 200*b*, and a conductive layer 210*b* is formed on the dielectric layer 208*b*. In the region 200*a*, the dielectric layer 208*a* is used as the gate dielectric layer of the P-type finFET, and the conductive layer 210*a* is used as the gate of the P-type finFET. In the region 200*b*, the dielectric layer 208*b* is used as the gate dielectric layer of the N-type finFET, and the conductive layer 210*b* is used as the gate of the N-type finFET. The forming methods of the dielectric layers 208*a* and 208*b* and the conductive layers 210*a* and 210*b* are known to those skilled in the art and are not repeated herein. Next, any known finFET process can be further performed. As a result, a P-type finFET and an N-type finFET can be respectively formed in the regions 200*a* and 200*b* separated by the recessed portion 100*b*.

In the present embodiment, the recessed portion 100*b* separates the plurality of fin portions 100*a*, and the doping layers 202 and 206 are both formed in the recessed portion 100*b* and partially fill the recessed portion 100*b*. Moreover, in the present embodiment, the resulting conductive layers 210*a* and 210*b* are both partially overlapped with the recessed portion 100*b*, but the invention is not limited thereto. In other embodiments, one of the conductive layers 210*a* and 210*b* can also not be overlapped with the recessed portion 100*b*, and the other of the conductive layers 210*a* and 210*b* can be partially or completely overlapped with the recessed portion 100*b*. Moreover, in the present embodiment, a doping layer containing a P-type dopant is first formed, and then a doping layer containing an N-type dopant is formed, but the invention is not limited thereto. In other embodiments, a doping layer containing an N-type dopant can be first formed, and then a doping layer containing a P-type dopant is formed.

Figure 3:
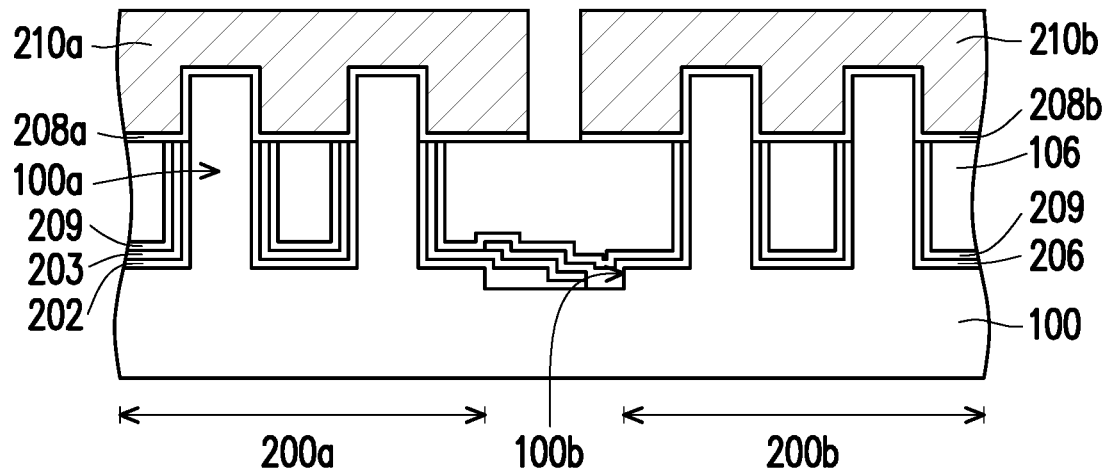
FIG. 3 is a cross section of a semiconductor structure shown according to the third embodiment of the invention.

FIG. 3 is a cross section of a semiconductor structure shown according to the third embodiment of the invention. Referring to FIG. 3, in the present embodiment, the difference from the structure of FIG. 2F is: the doping layers 202 and 206 formed in the recessed portion 100*b* completely fill the recessed portion 100*b*, and this can be achieved by adjusting the process parameters for forming the doping layers 202 and 206. Similarly, based on actual need, one of the conductive layers 210*a* and 210*b* can also not be overlapped with the recessed portion 100*b*, and the other of the conductive layers 210*a* and 210*b* can be partially overlapped or completely overlapped with the recessed portion 100*b*, and the forming order of the doping layer containing a P-type dopant and the doping layer containing an N-type dopant is also not limited.

Figure 4:
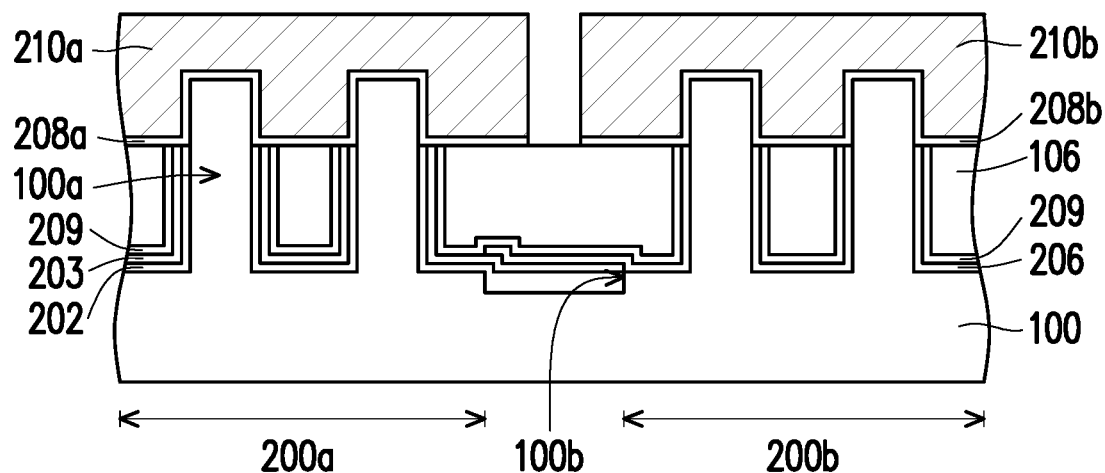
FIG. 4 is a cross section of a semiconductor structure shown according to the fourth embodiment of the invention.

FIG. 4 is a cross section of a semiconductor structure shown according to the fourth embodiment of the invention. Referring to FIG. 4, in the present embodiment, the difference from the structure of FIG. 2F is: the recessed portion 100*b* only has the doping layer 202, and the doping layer 202 completely fills the recessed portion 100*b*, and this can be achieved by adjusting the process parameters for forming the doping layer 202. In other embodiments, in the case that the doping layer containing an N-type dopant is formed before the doping layer containing a P-type dopant is formed, the doping layer containing an N-type dopant can also completely fill the recessed portion 100*b*. Based on actual need, one of the conductive layers 210*a* and 210*b* can also not be overlapped with the recessed portion 100*b*, and the other of the conductive layers 210*a* and 210*b* can be partially or completely overlapped with the recessed portion 100*b*.

Figure 5:
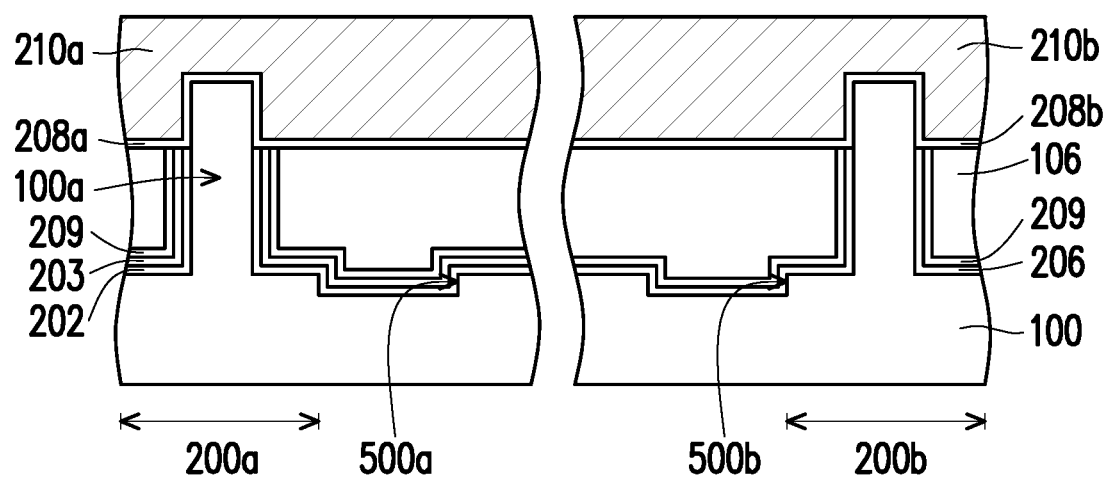
FIG. 5 is a cross section of a semiconductor structure shown according to the fifth embodiment of the invention.

FIG. 5 is a cross section of a semiconductor structure shown according to the fifth embodiment of the invention. Referring to FIG. 5, in the present embodiment, the difference from the structure of FIG. 2F is: a recessed portion 500*a* and a recessed portion 500*b* are disposed between a P-type region (the region 200*a*) and an N-type region (the region 200*b*), the recessed portion 500*a* only has the doping layer 202, the recessed portion 500*b* only has the doping layer 206, the doping layer 202 does not completely fill the recessed portion 500*a*, and the doping layer 206 does not completely fill the recessed portion 500*b*.

In other embodiments, the doping layer 202 completely fills the recessed portion 500*a* and/or the doping layer 206 completely fills the recessed portion 500*b*. Moreover, in the present embodiment, the conductive layer 210*a* and the recessed portion 500*a* are completely overlapped, and the conductive layer 210*b* and the recessed portion 500*b* are completely overlapped, but the invention is not limited thereto. In other embodiments, the conductive layer 210*a* can also be partially overlapped with the recessed portion 500*a*, and the conductive layer 210*b* can also be partially overlapped with the recessed portion 500*b*.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor structure, comprising:
   a substrate having a plurality of fin portions and at least one recessed portion, wherein the at least one recessed portion is located between two adjacent fin portions of the plurality of fin portions and a bottom surface of the at least one recessed portion is lower than a surface of the substrate between the two of the plurality of fin portions;
   a doping layer disposed on a sidewall of the plurality of fin portions, the surface of the substrate, and a sidewall and a bottom portion of the at least one recessed portion; and
   a dielectric layer disposed on the doping layer,
   wherein a top surface of the doping layer and a top surface of the dielectric layer are lower than a top surface of each of the plurality of fin portions, and
   wherein the doping layer comprises a first doping layer of a first conductivity type and second doping layer of a second conductivity type, and the plurality of fin portions comprise at least one first fin portion and at least one second fin portion,
   wherein the first and second doping layers have non-conformal thicker sections disposed within the at least one recessed portion.

2. The semiconductor structure of claim 1, wherein the doping layer completely fills the at least one recessed portion.

3. The semiconductor structure of claim 1, wherein the doping layer partially fills the at least one recessed portion, and two nitride liner layers are directly disposed on the first and second doping layers, respectively, inside the at least one recessed portion.

4. The semiconductor structure of claim 1, wherein the first doping layer is disposed on a sidewall of the first fin portion, a portion of the surface of the substrate, and a portion of the sidewall and a portion of the bottom portion of the at least one recessed portion, and the second doping layer is disposed on a sidewall of the second fin portion, a remaining sidewall and a remaining bottom portion of the at least one recessed portion, and the first doping layer in the at least one recessed portion.

5. The semiconductor structure of claim 4, wherein the first doping layer and the second doping layer completely fill the at least one recessed portion.

6. The semiconductor structure of claim 4, wherein the first doping layer and the second doping layer partially fill the at least one recessed portion, and two nitride liner layers are directly disposed on the first and second doping layers, respectively, inside the at least one recessed portion.

7. The semiconductor structure of claim 4, wherein the first doping layer completely fills the at least one recessed portion.

8. The semiconductor structure of claim 1, wherein the substrate has a first recessed portion and a second recessed portion located between the first fin portion and the second fin portion, the first doping layer is disposed on a sidewall of the first fin portion, a portion of the surface of the substrate, and a sidewall and a bottom portion of the first recessed portion, and the second doping layer is disposed on a sidewall of the second fin portion, a remaining surface of the substrate, and a sidewall and a bottom portion of the second recessed portion.

9. The semiconductor structure of claim 1, further comprising a conductive layer disposed on the dielectric layer and the plurality of fin portions exposed by the dielectric layer, wherein the conductive layer and the at least one recessed portion are at least partially overlapped.

* * * * *